United States Patent [19]
Hirumuta et al.

[11] Patent Number: 6,111,312
[45] Date of Patent: Aug. 29, 2000

[54] SEMICONDUCTOR DEVICE WITH LEADS ENGAGED WITH NOTCHES

[75] Inventors: Yosuke Hirumuta, Kawasaki; Yuji Akashi, Kasugai; Susumu Kida, Kawasaki, all of Japan

[73] Assignee: Fujitsu Limited, Kawasaki, Japan

[21] Appl. No.: 09/324,167

[22] Filed: Jun. 2, 1999

[30]  Foreign Application Priority Data

Aug. 20, 1998 [JP] Japan .................................. 10-234705
Feb. 1, 1999 [JP] Japan .................................. 11-024307

[51] Int. Cl.$^7$ .................................................. H01L 23/48
[52] U.S. Cl. .......................... 257/696; 257/666; 257/692; 257/787
[58] Field of Search .................................... 257/787, 692, 257/666, 696

[56]  References Cited

U.S. PATENT DOCUMENTS 5,327,104  7/1994  Kikushima ............................. 257/787

FOREIGN PATENT DOCUMENTS 5-74668  3/1993  Japan .

*Primary Examiner*—Roy Potter
*Attorney, Agent, or Firm*—Armstrong, Westerman, Hattori, McLeland & Naughton

[57]  ABSTRACT

A semiconductor device is provided. This semiconductor device includes a resin package, a semiconductor chip, and leads consisting of inner leads and outer leads. The rear surface of the semiconductor chip and the inner leads are situated substantially on the same plane. The resin package is provided with notches on its mounting surface. The outer leads are bent inward along the exterior of the resin package and pulled around to the mounting surface, so that the edges of the outer leads are engaged with the notches.

7 Claims, 15 Drawing Sheets

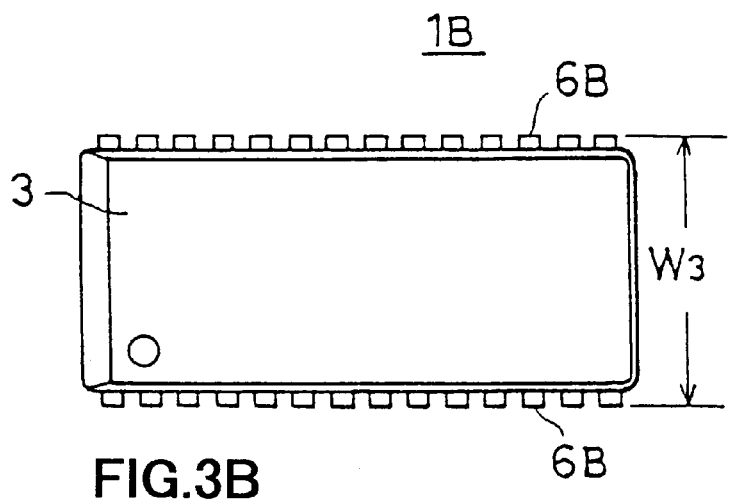
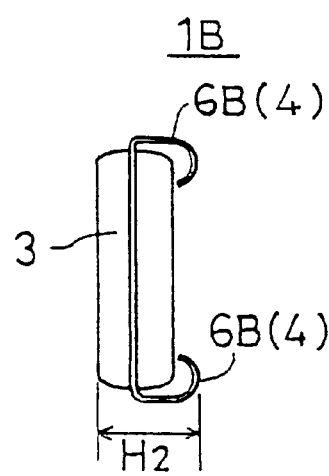
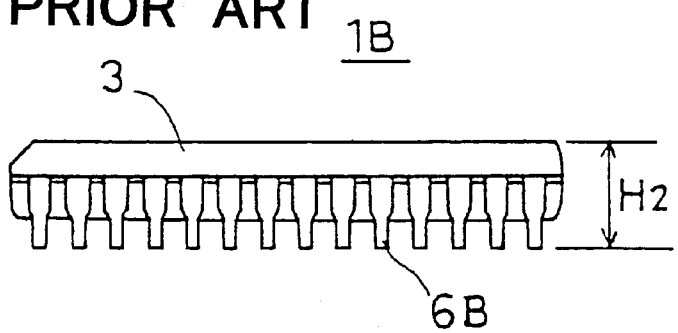
FIG.3A PRIOR ART
FIG.3C PRIOR ART
FIG.3B PRIOR ART

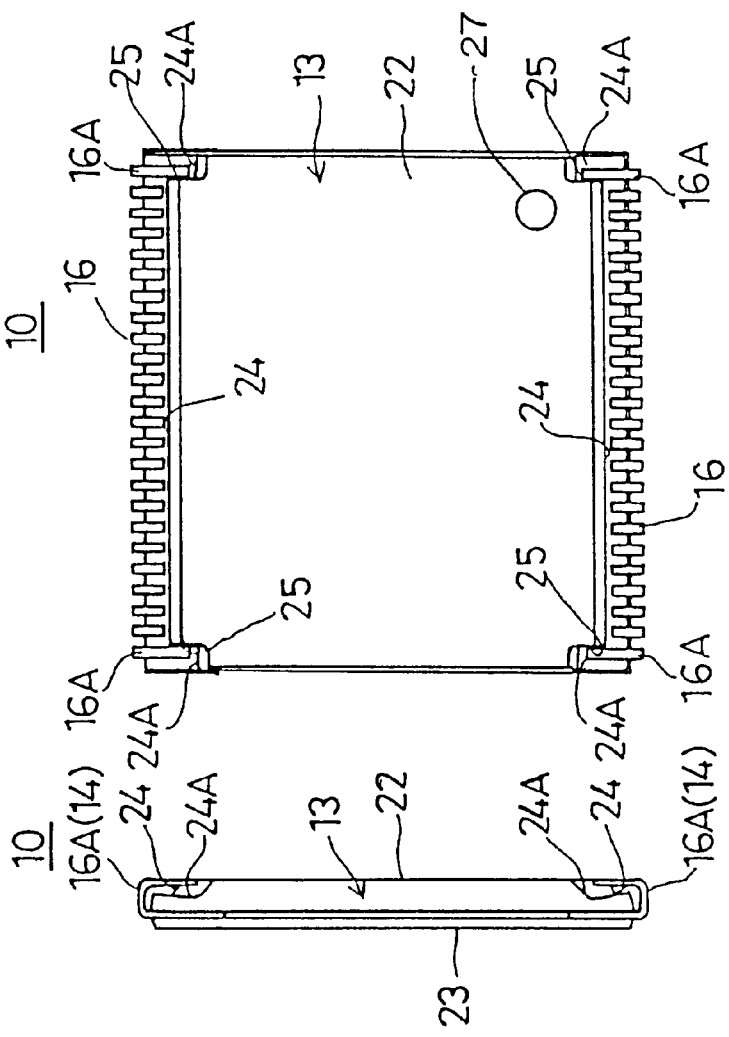
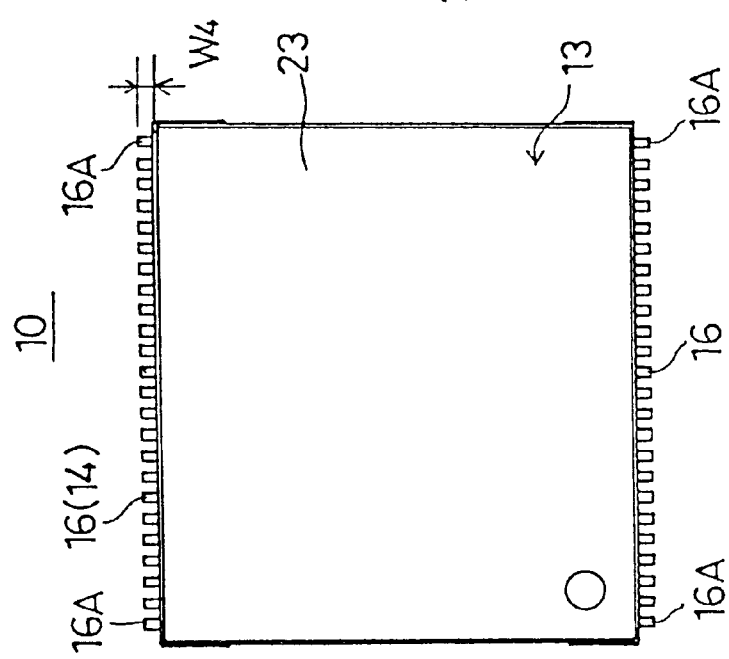
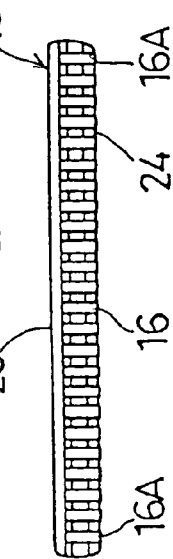

SEMICONDUCTOR DEVICE WITH LEADS ENGAGED WITH NOTCHES

BACKGROUND OF THE INVENTION

1. Field of the Invention

The present invention generally relates to a semiconductor device and a method of producing the semiconductor device and, more particularly, to a semiconductor device having leads as outer connecting terminals and a method of producing such a semiconductor device.

2. Description of the Related Art

In recent years, electronic equipment, such as portable telephones and portable personal computers, have been rapidly becoming smaller and thinner. Semiconductor devices mounted in these electronic equipment are now expected to be smaller and thinner accordingly.

FIGS. 1A to 3C illustrate conventional semiconductor devices.

The semiconductor device 1A shown in FIGS. 1A to 2 is of a surface mount package type, and has a package structure called SOP (Small Outline Package). The semiconductor device 1A comprises a semiconductor chip 2, a resin package 3, and leads 4.

The semiconductor chip 2 is mounted on a stage 7, and sealed in the resin package 3. The leads 4 are made up of inner leads 5 electrically connected to the semiconductor chip 2 by wires 8 and sealed in the resin package 3, and outer leads 6A extending outward from the resin package 3. The outer leads 6A are shaped like gull wings so as to be suitable for a surface mount package.

To maintain a desired balance in the semiconductor device 1A, the semiconductor chip 2 is preferably situated in the center of the resin package 3. The stage 7 is situated in a lower position than the inner leads 5 by a length H0 shown in FIG. 2, so that the semiconductor chip 2 is situated in the center of the resin package 3.

A semiconductor device 1B shown in FIGS. 3A to 3C has a package structure called SOJ (Small Outline J-lead Package). Like the semiconductor device 1A, the semiconductor device 1B is of the surface mount package type. As the inner structure of the semiconductor device 1B is almost the same as the structure shown in FIG. 2, it is not shown in the drawings. In the SOJ-type semiconductor device 1B, outer leads 6B are bent inward and molded into J-shapes.

However, the SOP-type semiconductor device 1A shown in FIGS. 1A to 1C has the following problem. Since the outer leads 6A extend outward from the resin package 3, the total width W2 of the semiconductor device 1A is far greater than the width W1 of the resin package 3. As a result, the SOP-type semiconductor device 1A is large due to the additional length of the outer leads 6A, and fails to respond to the demand for smaller semiconductor devices.

As for the inner structure of the semiconductor device 1A, the stage 7 is situated in a lower position than the inner leads 5 by the length H0 so as to maintain the desired balance in the device. However, with the positional difference between the stage 7 and the inner leads 5, the height H1 of the semiconductor device 1A becomes too high due to the length H0. As a result the semiconductor device 1A fails to satisfy the demand for smaller semiconductor devices.

Also, extending outward from the resin package 3, the outer leads 6A tend to be deformed by an external force, thereby reducing the reliability of the semiconductor device 1A. Particularly, the outer leads 6A formed at the four corners are liable to be deformed.

In the SOJ-type semiconductor device 1B shown in FIGS. 3A to 3C, the outer leads 6B are bent inward and molded into J-shapes, so that the total width W3 of the semiconductor device 1B is smaller than the width W2 of the SOP-type semiconductor device 1A.

However, the length of the J-shaped outer leads 6B protruding from the bottom surface of the resin package 3 is large, thereby increasing the height H2 of the semiconductor device 1B. The SOJ-type semiconductor device 1B can be smaller in a plan view, but cannot be thinner as desired. Also, excellent molding precision is difficult to obtain in the SOJ-type semiconductor device 1B, because the outer leads 6B are greatly bent inward and molded into J-shapes.

SUMMARY OF THE INVENTION

A general object of the present invention is to provide a semiconductor device in which the above disadvantages are eliminated.

A more specific object of the present invention is to provide a semiconductor device which can prevent deformation of the outer leads, and is smaller and thinner than conventional semiconductor devices.

The objects of the present invention are achieved by a semiconductor device which includes a resin package, a semiconductor chip, and a plurality of leads. The semiconductor chip is sealed in the resin package. The leads consist of inner leads electrically connected to the semiconductor chip and outer leads extending outward from the resin package and bonded to a printed-circuit board. The rear surface of the semiconductor chip is situated substantially on the same plane as the inner leads. The resin package is provided with notches on its mounting surface facing the printed-circuit board. The outer leads are bent inward along the exterior of the resin package and pulled around to the mounting surface, so that the edges of the outer leads are engaged with the notches.

Since the rear surface of the semiconductor chip and the inner leads are situated substantially on the same plane, the total height of the semiconductor chip and the inner leads can be smaller than a conventional semiconductor chip and inner leads. The resin package can be made thinner accordingly.

Also, since the outer leads are bent inward along the exterior of the resin package, the extended portion of the outer leads outward from the resin package can be made smaller. The area of the semiconductor device in a plan view can be smaller accordingly, thereby reducing the size of the semiconductor device.

Furthermore, since the edges of the bent outer leads are engaged with the notches formed on the mounting surface of the resin package, the outer leads do not protrude from the mounting surface, thereby reducing the height of the semiconductor device.

The objects of the present invention are also achieved by a method of producing a semiconductor device having a resin package, a semiconductor chip mounted on a stage and sealed in the resin package, and a plurality of leads consisting of inner leads electrically connected to the semiconductor chip and outer leads extending outward from the resin package and bonded to a printed-circuit board. This method includes the step of pulling around the outer leads to a mounting surface facing the printed-circuit board by bending the outer leads inward along the exterior of the resin package. First, the leads are temporarily bent in a direction opposite to a molding direction. The leads are then bent along the exterior of the resin package in the molding direction. By this method, the formation precision of the outer leads can be improved.

The leads are horizontal prior to the bending. When the leads are bent in the molding direction along the exterior of the resin package, the leads start bending with the end portions of the resin package as the support points. As a result, an excessive load is applied to the end portions of the resin package, and the positioning accuracy in bending the outer leads is reduced.

In view of this, the leads are temporarily bent in the direction opposite to the molding direction, and then bent in the molding direction. Here, the portions bent in the molding direction are situated at a distance from the end portions of the resin package. Thus, an excessive load can be prevented at the end portions of the resin package, and the formation precision of the outer leads can be improved.

The above and other objects and features of the present invention will become more apparent from the following description taken in conjunction with the accompanying drawings.

BRIEF DESCRIPTION OF THE DRAWINGS

FIGS. 3A to 3C illustrate a conventional semiconductor device (SOJ);

FIG. 5A is a plan view of the semiconductor device of FIG. 4;

FIG. 5B is a side view of the semiconductor device of FIG. 4;

FIG. 5C is a bottom view of the semiconductor device of FIG. 4;

FIG. 5D is a front view of the semiconductor device of FIG. 4;

DESCRIPTION OF THE PREFERRED EMBODIMENTS

The following is a description of the embodiments of the present invention, with reference to the accompanying drawings.

Figure 4:
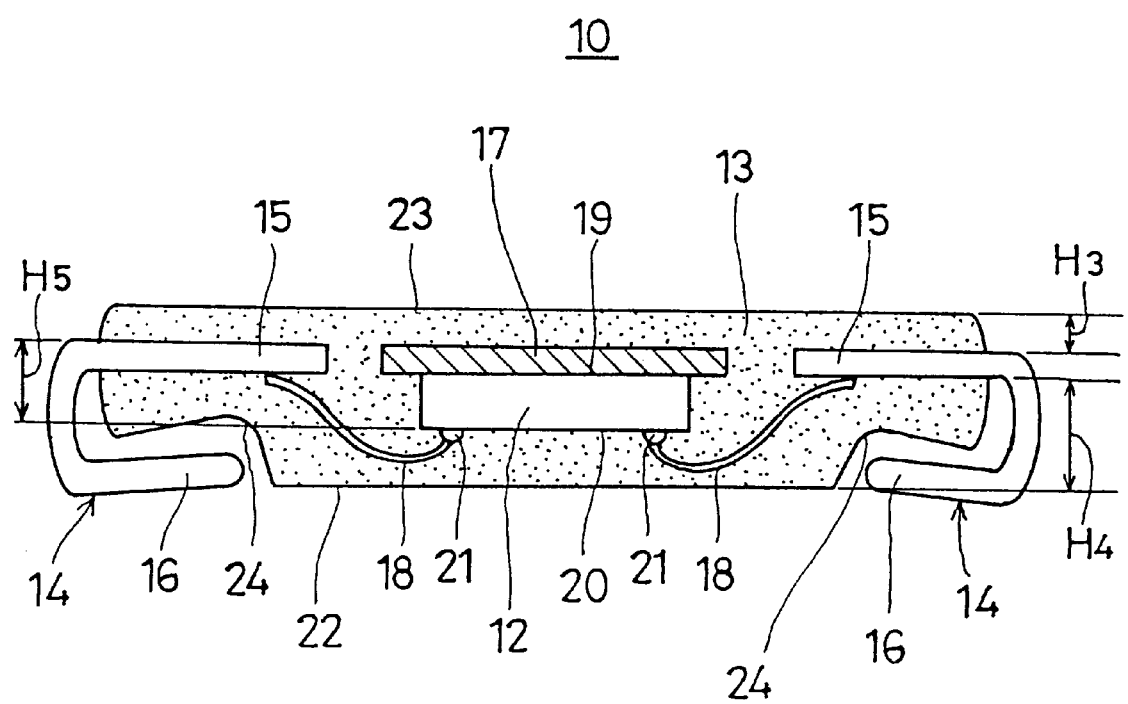
FIG. 4 is a sectional view of a semiconductor device of one embodiment of the present invention.

FIGS. 4 to 5D illustrate a semiconductor device 10 in accordance with one embodiment of the present invention. The semiconductor device 10 comprises a semiconductor chip 12, a resin package 13, and leads 14.

The semiconductor chip 12 is a chip for a flash memory, for instance. The bottom surface of the semiconductor chip 12 shown in FIG. 4 is a circuit formation surface 20. A circuit which functions as a flash memory and electrode pads 21 are formed on the circuit formation surface 20. The surface of the semiconductor chip 12 opposite to the circuit formation surface 20 is bonded to a stage 17, so that the semiconductor chip 12 is mounted on the stage 17. The surface bonded to the stage 17 will be hereinafter referred to as a chip rear surface 19.

The resin package 13 seals the semiconductor chip 12 so as to protect the chip 12. The resin package 13 is made of an epoxy resin, and is formed by a transfer molding method in which a metal mold is used. In forming the resin package 13, the bottom surface of the resin package 13 in FIG. 4 is provided with notches 24 and 24A, and an index 27.

The notches 24 and 24A are engaged with the edges of outer leads 16 and 16A, which constitute the leads 14. As shown in FIG. 5C, the notches 24 and 24A are formed on two opposite sides of the mounting surface 22. The notches 24A situated at the four corners of the resin package 13 are greater in length than the notches 24 situated in places other than the four corners, as shown in the enlarged view of FIG. 7. The notches 24A will be hereinafter referred to as the four-corner notches 24A.

More specifically, the length L4 of each of the four-corner notches 24A is longer than the length L3 of each of the notches 24 (L4>L3). The difference between the lengths L3 and L4 forms bumps 25 on the boundaries between the notches 24 and the four-corner notches 24A.

Figure 6:
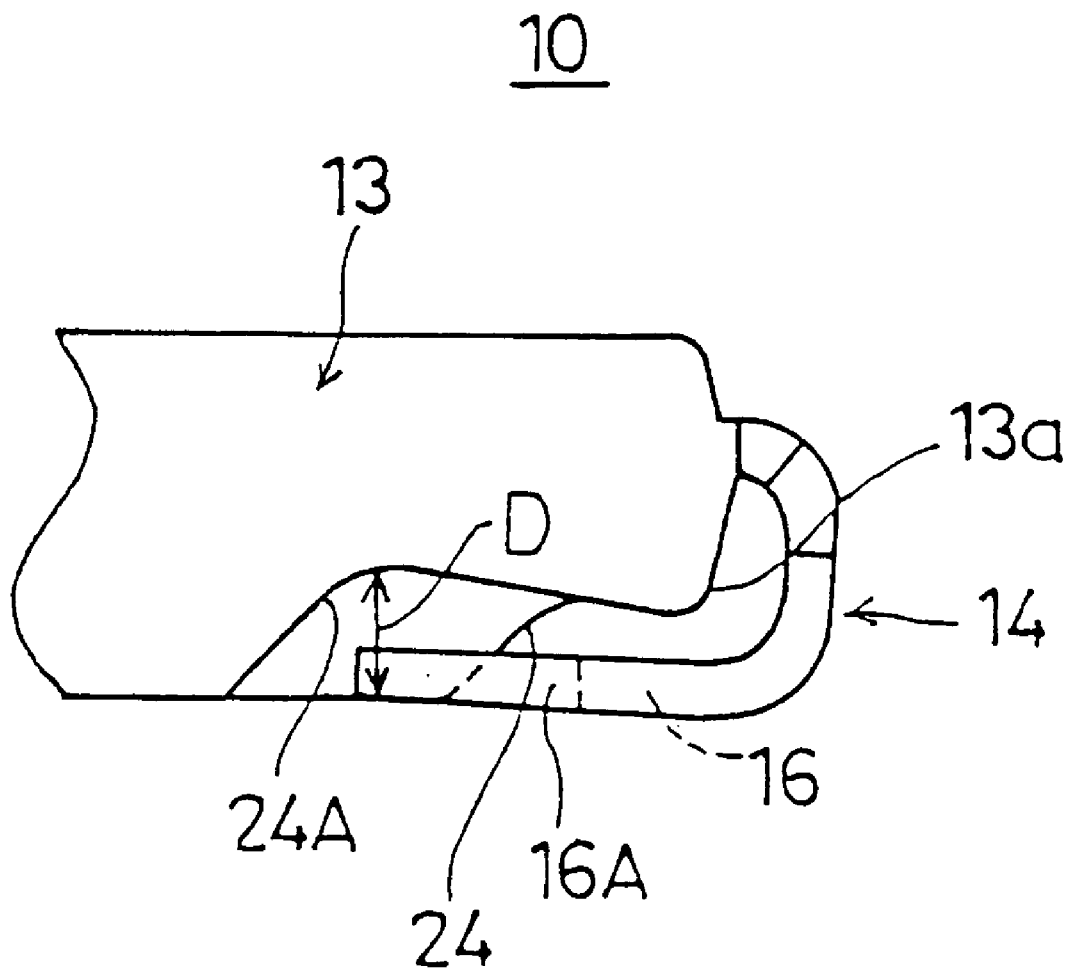
FIG. 6 is an enlarged side view of the semiconductor device of the embodiment of the present invention.

As shown in the side view of a notch 24 and a four-corner notch 24A in FIG. 6, both notches 24 and 24A are progressively deeper toward an interior from an exterior of the resin package 13.

A metal cavity for molding the resin package 13 is provided with convex portions, so that the notches 24 and 24A can be easily formed.

The index 27 indicates a reference position of the terminal numbers allotted to the leads 14, and the reference position can be recognized from a concave portion formed on the resin package 13. Normally, a traceable identification character code is etched in the resin package to indicate the type and system of the semiconductor.

Figure 7:
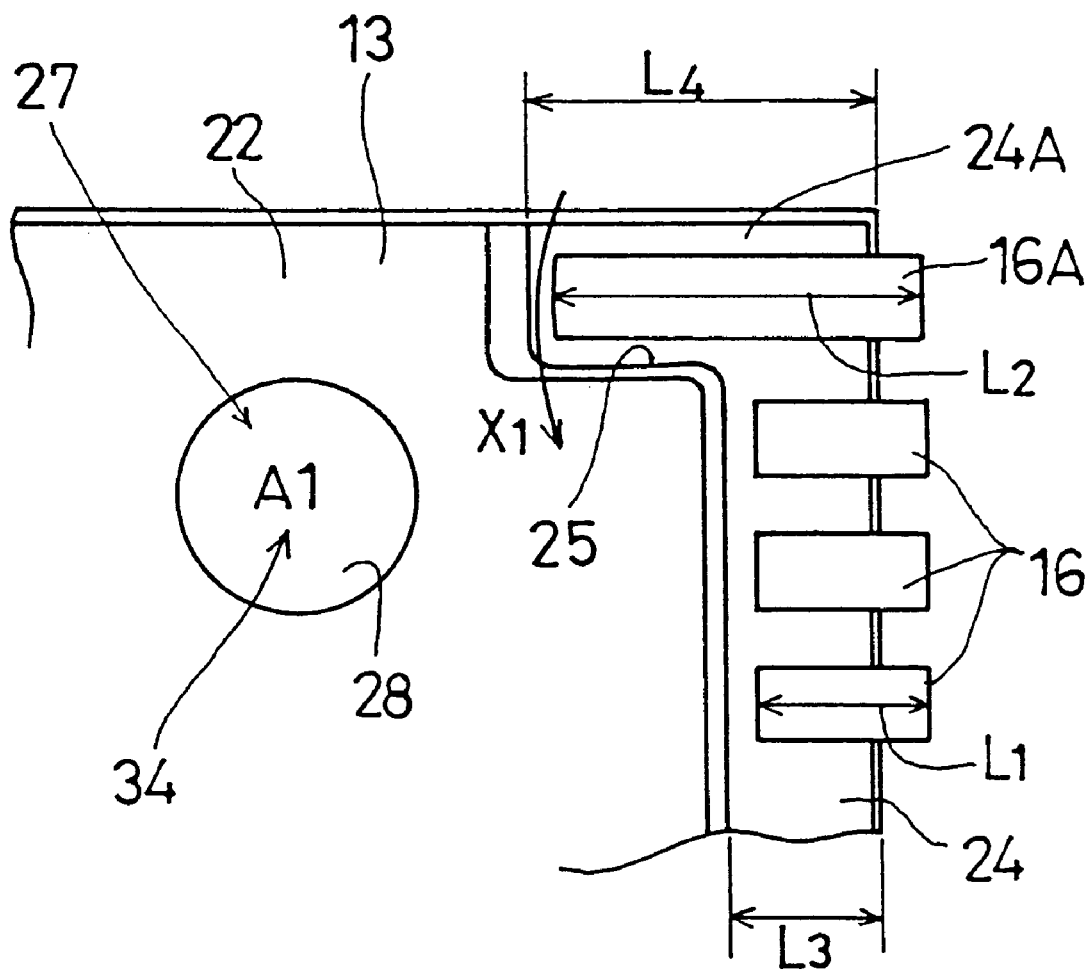
FIG. 7 is an enlarged bottom view of the semiconductor device of the embodiment of the present invention.
Figure 10A:
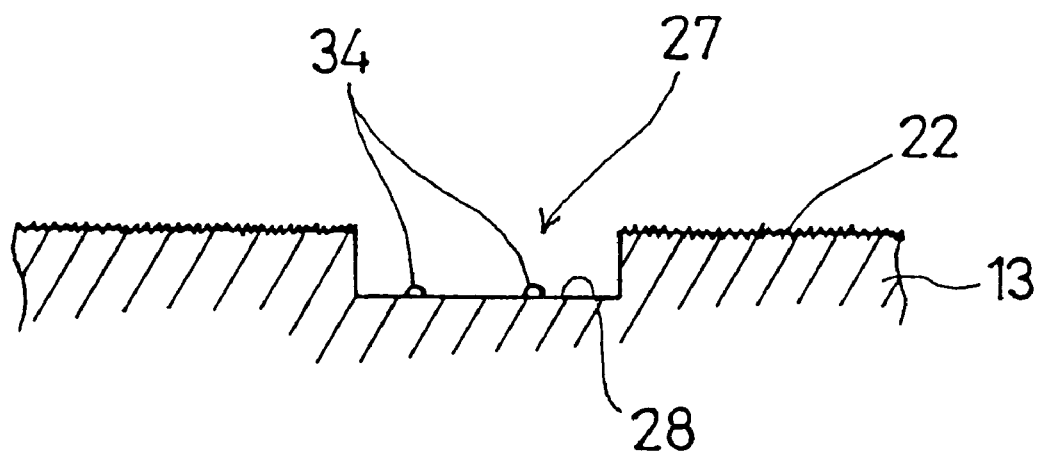
FIGS. 10A and 10B show the difference in optical characteristics between the index and the mounting surface.
Figure 10B:
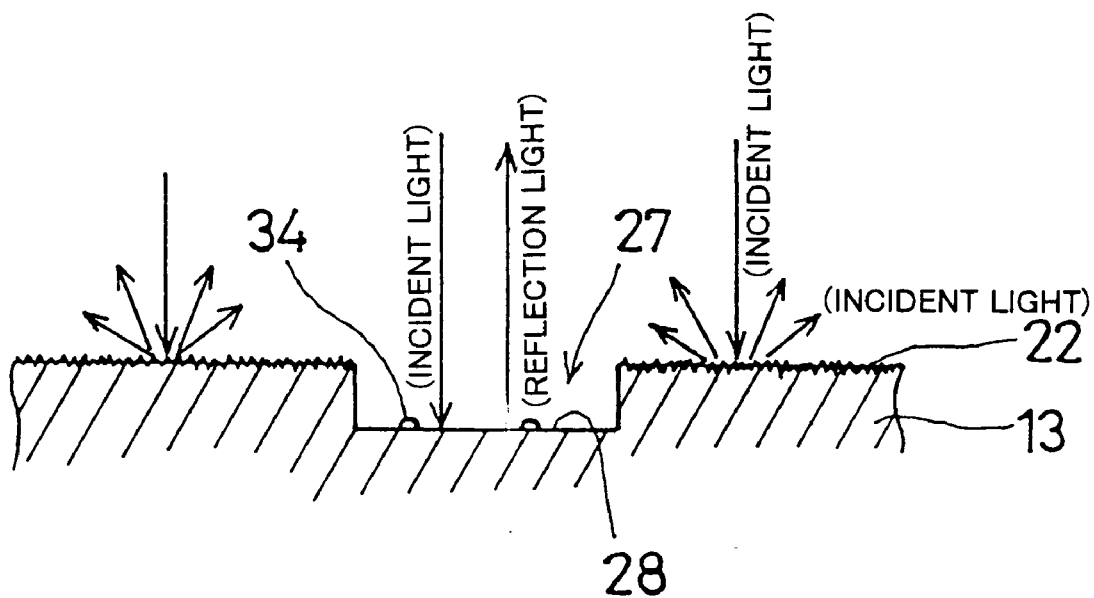

As shown in FIGS. 7, 10A, and 10B, the semiconductor device 10 of this embodiment has the identification character code 34 formed inside the index 27 (more specifically, on the bottom surface 28 of the concavity of the index 27). The identification character code 34 can be formed at the same time as the molding of the resin package 13. Compared with the conventional resin package molding step in which the identification character code is formed separately, forming the identification character code 34 inside the index 27 simplifies the production procedures.

It is preferable to automatically recognize the position of the index 27, and an optical device can be employed as an automatic recognition unit. However, since the surface of the resin package 13 and the bottom surface 28 of the index 27 conventionally have the same characteristics (both have mirror-like surfaces), automatic recognition by an optical device has been difficult.

In this embodiment, the surface of the resin package 13 and the bottom surface 28 of the index 27 have different optical characteristics. More specifically, the surface of the resin package 13 is matte, and the bottom surface 28 of the index 27 is of a mirror type, as shown in FIGS. 10A and 10B.

When the mounting surface 22 of the resin package 13 is irradiated with light, the amount of light reflected by the bottom surface 28 of the index 27 having high reflectance becomes larger, while the amount of light reflected by the mounting surface of the resin package having low reflectance becomes smaller. Because of the large difference in the amount of reflection light between the index 27 and the other positions, accurate recognition of the position of the index 27 can be easily obtained.

As described above, the bottom surface 28 of the index 27 is a mirror surface, and the identification character code 34 is formed on the bottom surface 28. Thus, the visibility of the identification character code 34 can be improved, compared with the identification character code formed on the mounting surface in a conventional structure.

As shown in FIG. 10, the identification character code 34 is character-shaped small protrusions formed on the bottom surface 28. The visibility of the identification character code 34 would be lower if formed on the matte mounting 10 surface 22. To obtain high visibility, the difference between the amount of light reflected by the identification character code 34 and the amount of light reflected by the peripheral areas of the identification character code 34 should be large.

In this embodiment, the visibility of the identification character code 34 is improved by forming the small protrusions (having smaller reflectance than a mirror surface) on the bottom surface 28 of the index 27 having high reflection.

It is preferable to make the entire bottom surface 28 a mirror surface so as to improve the recognition accuracy of the index 27. However, the formation area of the identification character code 34 on the bottom surface 28 is small, as shown in FIG. 7, so that the identification character code 34 does not lower the recognition accuracy of the index 27.

The leads 14 include inner leads 15 and outer leads 16 and 16A. The inner leads 15 are electrically connected to the electrode pads 21 provided to the semiconductor chip 12 by wires 18. As shown in FIG. 4, the inner leads 15 are sealed in the resin package 13 together with the semiconductor chip 12, so that the leads 14 are held by the resin package 13.

The inner leads 15 are situated substantially on the same plane as the stage 17, on which the semiconductor chip 12 is mounted. Accordingly, the rear surface 19 of the semiconductor chip 12 and the inner leads 15 are situated substantially on the same plane.

The leads 14 and the stage 17 are integrally formed in the lead frame stage (the stage prior to molding), so that the inner leads 15 and the stage 17 can be easily formed on the same plane.

In this embodiment, the thickness of the resin package 13 above the inner leads 15 is H3, while the thickness of the resin package 13 under the inner leads 15 is H4. Here, the H3 to H4 ratio is approximately 1:2.

The outer leads 16 and 16A extend outward from the resin package 13. The edges of the outer leads 16 and 16A are pulled around to the mounting surface 22 of the resin package 13 by bending the outer leads 16 and 16A inward along the exterior of the resin package 13. The bent outer leads 16 and 16A are engaged with the notches 24 and 24A formed on the resin package 13.

Since the notches 24 and 24A are deeper in inward positions in the resin package 13, even if the outer leads 16 and 16A are bent further than the mounting surface 22, the edges of the outer leads 16 and 16A can be prevented from touching the resin package 13.

In the above manner, the outer leads 16 and 16A can be accurately bent and engaged with the notches 24 and 24A, while the resin package 13 can be prevented from being damaged.

The four-corner outer leads 16A situated at the four corners of the resin package 13 are longer than the outer leads 16 situated in positions other than the four corners.

More specifically, the length L1 of each outer lead 16 is shorter than the length L2 of each four-corner outer lead 16A. The outer leads 16 are engaged with the notches 24, while the four-corner outer leads 16A are engaged with the four-corner notches 24A.

As described above, the bumps 25 are formed between the notches 24 and the four-corner notches 24A at the four corners of the resin package 13. The length of each four-corner outer lead 16A corresponds to the length of each four-corner notch 24A.

As shown in FIG. 7, movement of the four-corner outer leads 16A is restricted by the bumps 25 in a surface direction (the direction indicated by an arrow X1 in the figure). In this manner, the four-corner outer leads 16A can be prevented from being deformed, though they are situated at the four corners of the resin package 13 where deformation can be easily caused. Thus, the reliability of the semiconductor device 10 can be improved.

Figure 8:
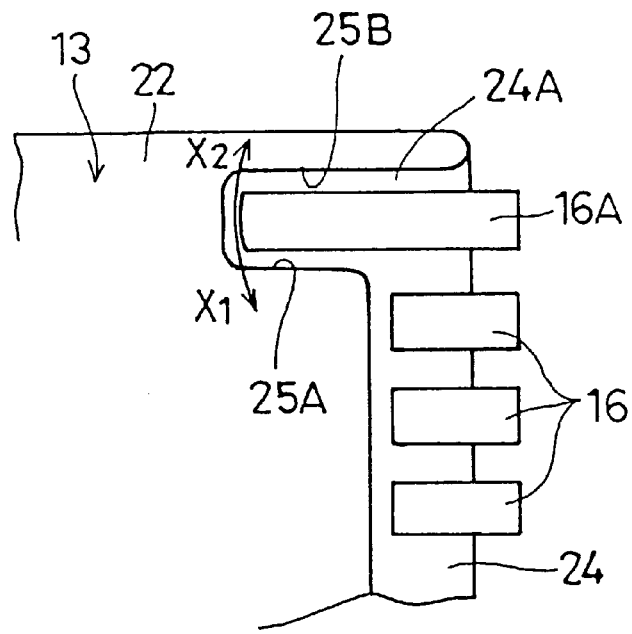
FIG. 8 illustrates a modification of four-corner notches.

In FIG. 7, the bumps 25 only face the inner side surfaces of the four-corner outer leads 16A. As shown in FIG. 8, however, the notches 24 and 24A may be formed so that bumps 25A and 25B can be formed on both sides of each four-corner outer lead 16A.

In this structure, movement of the four-corner outer leads 16A is restricted by the bumps 25A and 25B in two directions indicated by arrows X1 and X2 in FIG. 8. Thus, the four-corner outer leads 16A can be more certainly prevented from being deformed, and the reliability of the semiconductor device 10 can be further improved.

As described above, the inner leads 15 and the stage 17 are situated substantially on the same plane in this embodiment, so that the rear surface 19 of the semiconductor chip 12 is situated substantially on the same surface as the inner leads 15.

Figure 1A:
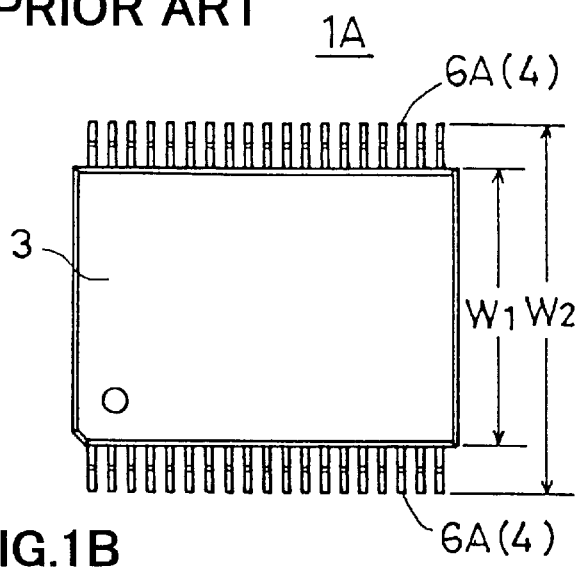
FIGS. 1A to 1C illustrate a conventional semiconductor device (SOP)
Figure 1C:
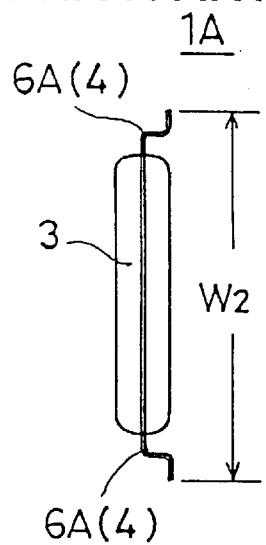
Figure 1B:
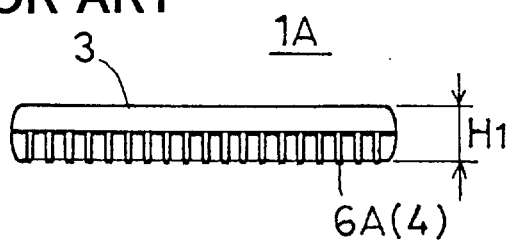
Figure 2:
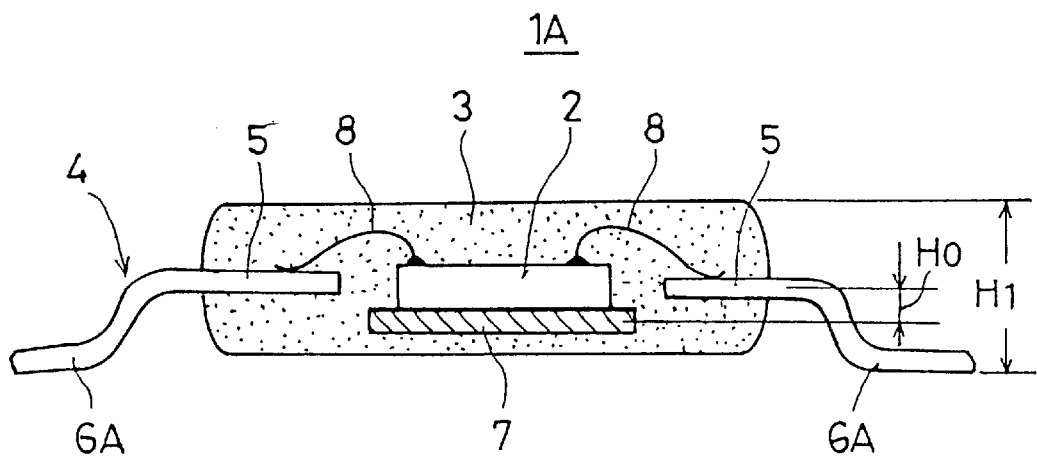
FIG. 2 is a sectional view of the semiconductor device of FIGS. 1A to 1C.

Compared with the conventional structure in which bumps are formed between the inner leads 5 and the stage 7 so as to form bumps between the rear surface of the semiconductor chip 2 and the inner leads 5 (FIG. 2), the entire height including the semiconductor chip 12 and the inner leads 15 (shown by an arrow H5 in FIG. 4) can be smaller. Thus, the resin package 13 can be thinner, and the height of the semiconductor device 10 can be smaller accordingly.

The semiconductor device 10 of this embodiment has the outer leads 16 and 16A bent inward along the exterior of the resin package 13. With this structure, the amount of extension (indicated by an arrow W4 in FIG. 5A) of the outer leads 16 and 16A outward from the resin package 13 can be small. The area of the semiconductor device 10 in a plan view is smaller accordingly. Thus, the semiconductor device 10 can be smaller.

In the semiconductor device 10, the notches 24 and 24A are formed on the mounting surface 22 of the resin package 13, so that the edges of the bent outer leads 16 and 16A are engaged with the notches 24 and 24A.

As shown in FIGS. 4, 5B, 5D, and FIG. 6, the outer leads 16 and 16A do not protrude from the mounting surface 22, but are situated substantially on the same plane. Thus, the semiconductor device 10 can be small in height.

As shown in FIGS. 4 and 5C, when the outer leads 16 and 16A are engaged with the notches 24 and 24A, the outer leads 16 and 16A are exposed from the resin package 13. With this structure, the bond between the semiconductor device 10 and the printed-circuit board can be maintained.

Figure 11:
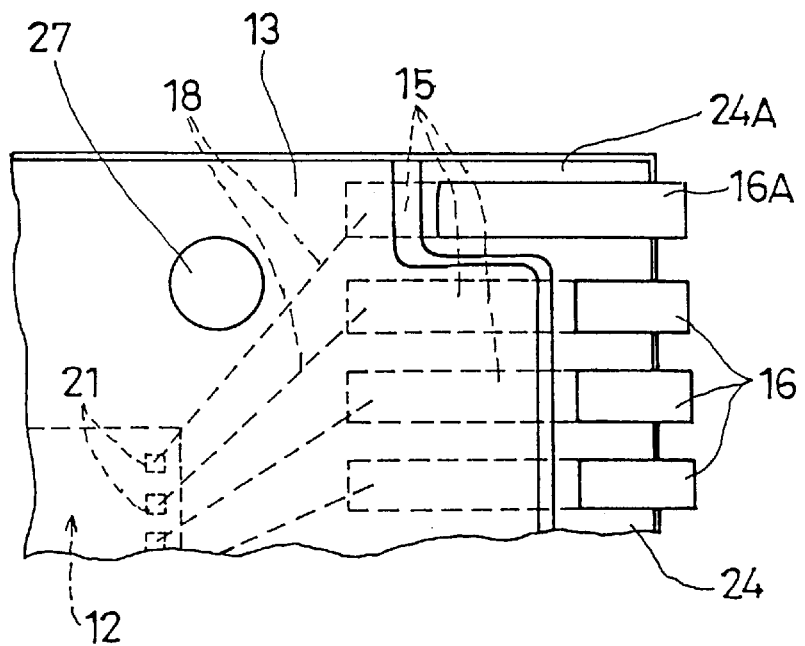
FIG. 11 shows an index formation position in the present invention.
Figure 12:
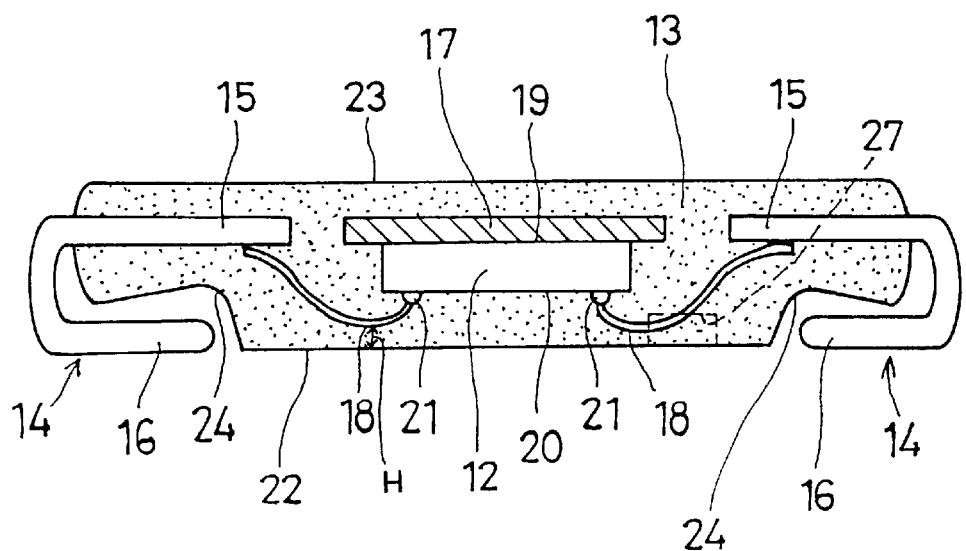
FIG. 12 shows an index formation position in the present invention.

FIGS. 11 and 12 show the relationship between the formation position of the index 27 and the formation position of the wires 18. In the semiconductor device 10 of this embodiment, the index 27 and the wires 18 are situated separately, as shown in the figures. By separating the index 27 from the wires 18, the wires 18 can be prevented from being exposed from the formation position of the index 27, even if the resin package 13 is thin.

The bonded wires 18 are loop-shaped, and the top of the wires 18 are situated near the surface (the mounting surface 22) of the resin package. The distance between the mounting surface 22 and the top of each wire 18 (indicated by an arrow H in FIG. 12) is short. As mentioned above, the index 27 is a concave portion formed on the resin package 13.

Figure 13:
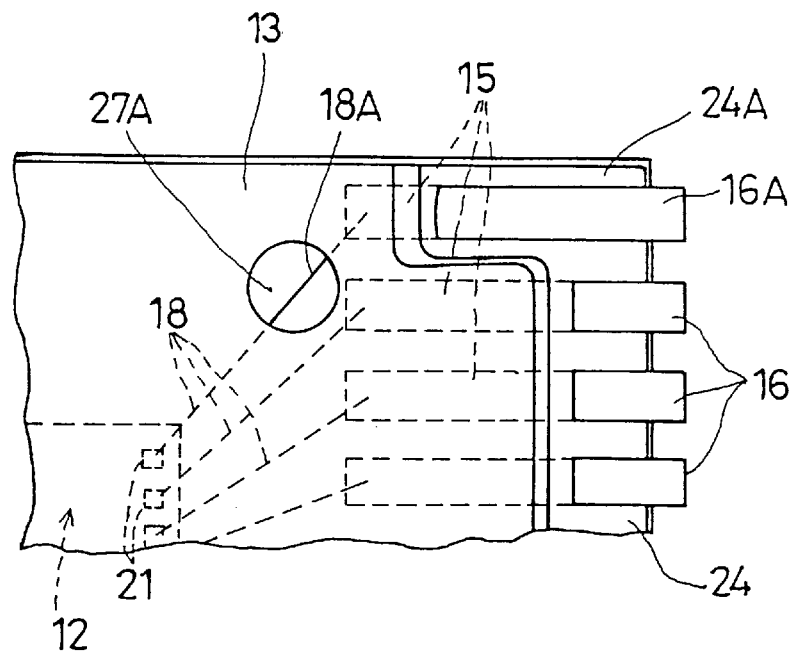
FIG. 13 shows a conventional index formation position.
Figure 14:
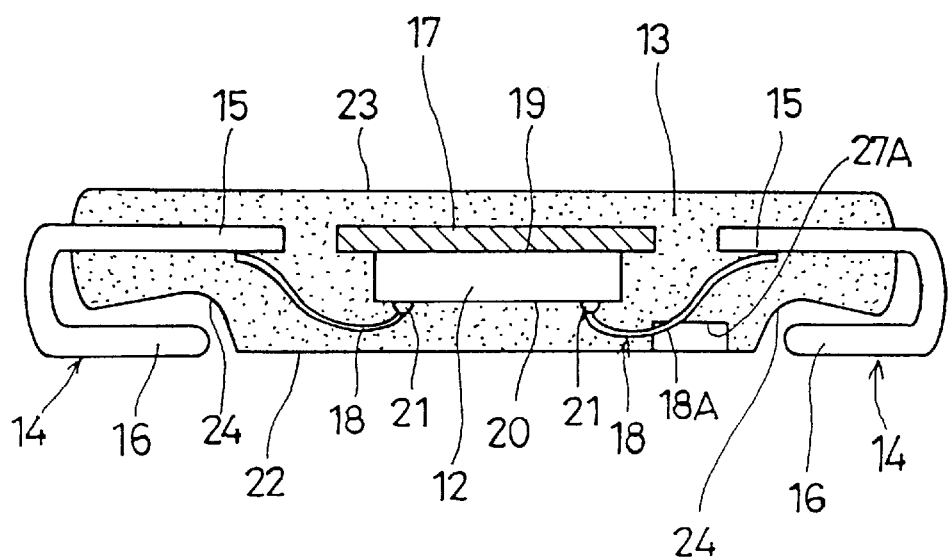
FIG. 14 shows a conventional index formation position.

As shown in FIGS. 13 and 14, if the index 27 is formed in the position of the wires 18, there is a possibility that a part of the wires 18 is exposed from the bottom surface 28 of the index 27 (in FIGS. 13 and 14, the exposed part of the wires 18 is referred to as an exposed portion 18A). The exposed portion 18A on the surface of the resin package 13 reduces the reliability of the semiconductor device 10.

By separating the index 27 from the wires 18, the wires 18 can be prevented from being exposed from the formation position of the index 27 (or the exposed portion 18A can be prevented in the index 27), even if the distance H between the top of the wires 18 and the mounting surface 22 is short. Thus, high reliability of the thinned semiconductor device 10 can be maintained.

Figure 9:
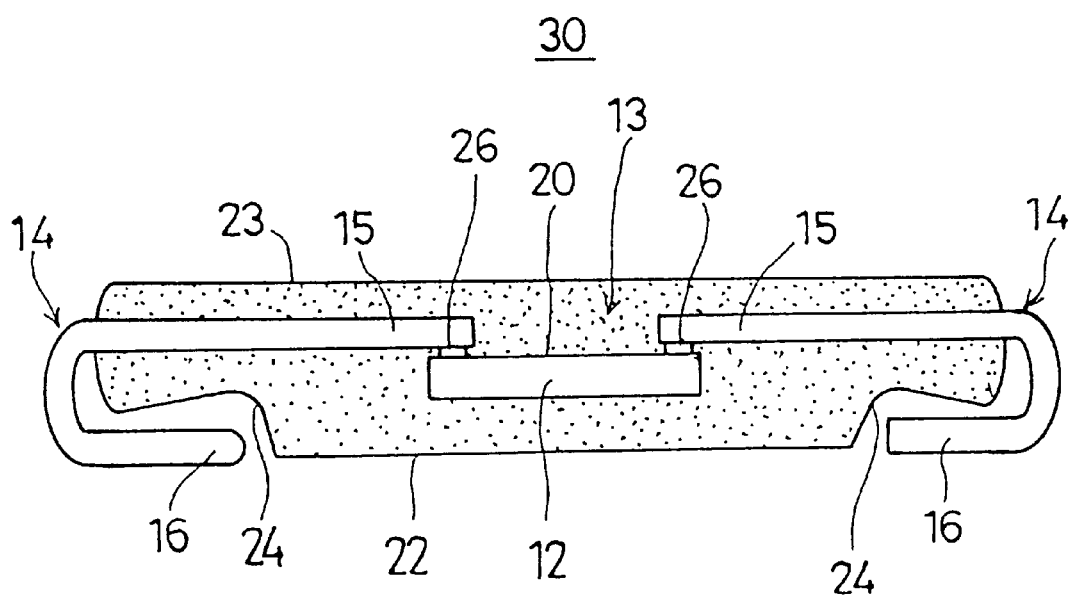
FIG. 9 illustrates a modification of the semiconductor device of FIG. 4.

FIG. 9 illustrates a semiconductor device 30 which is a modification of the semiconductor device 10.

The semiconductor device 10 shown in FIGS. 4 to 8 has the wires 18 for electrically connecting the semiconductor chip 12 and the inner leads 15.

On the other hand, the semiconductor device 30 employs flip-chip bonding to electrically connect the semiconductor chip 12 and the inner leads 15. More specifically, bumps 26 are formed on the circuit formation surface 20 of the semiconductor chip 12, and flip-chip bonded to the inner leads 15, thereby bonding the semiconductor chip 12 to the inner leads 15.

In the semiconductor device 10 employing the wires 18 shown in FIGS. 4 to 8, a region for forming wire loops needs to be created inside the resin package 13. As a result, the height of the resin package 13 becomes greater.

The flip-chip bonding of the semiconductor chip 12 to the inner leads 15 eliminates the necessity of forming the wire loop region inside the resin package 13, thereby making the resin package 13 thinner. The semiconductor device 30 is even thinner than the semiconductor device 10.

FIGS. 15 to 19 illustrate the method of producing the semiconductor device 10 of the present invention.

This method comprises a number of steps, but the method of this embodiment is characterized by the lead frame cutting step and the lead molding step. As the other steps in this method are well known, the following description only concerns the lead frame cutting step and the lead molding step.

Figure 15:
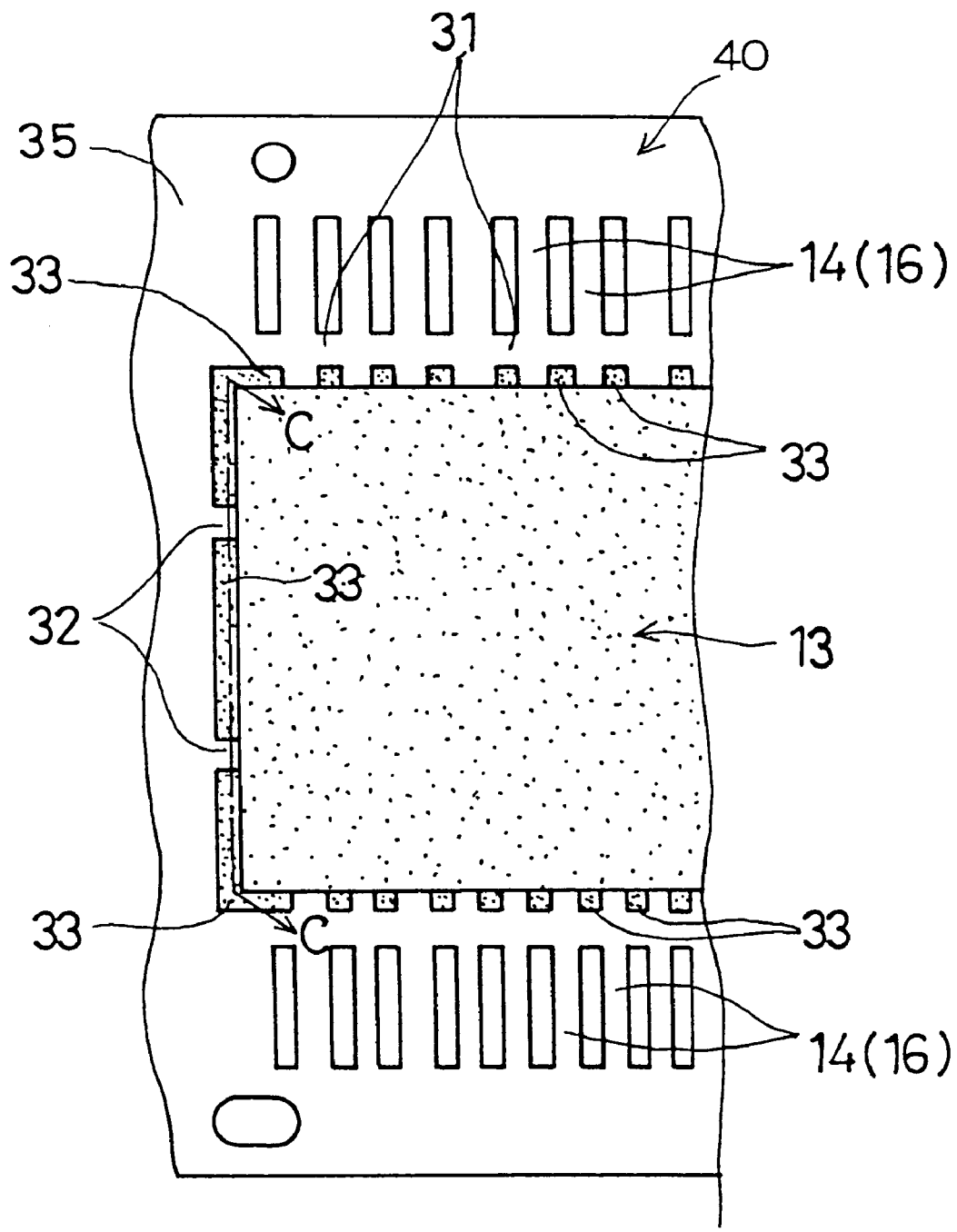
FIG. 15 illustrates a lead frame cutting step in a method of producing the semiconductor device of the present invention.
Figure 16:
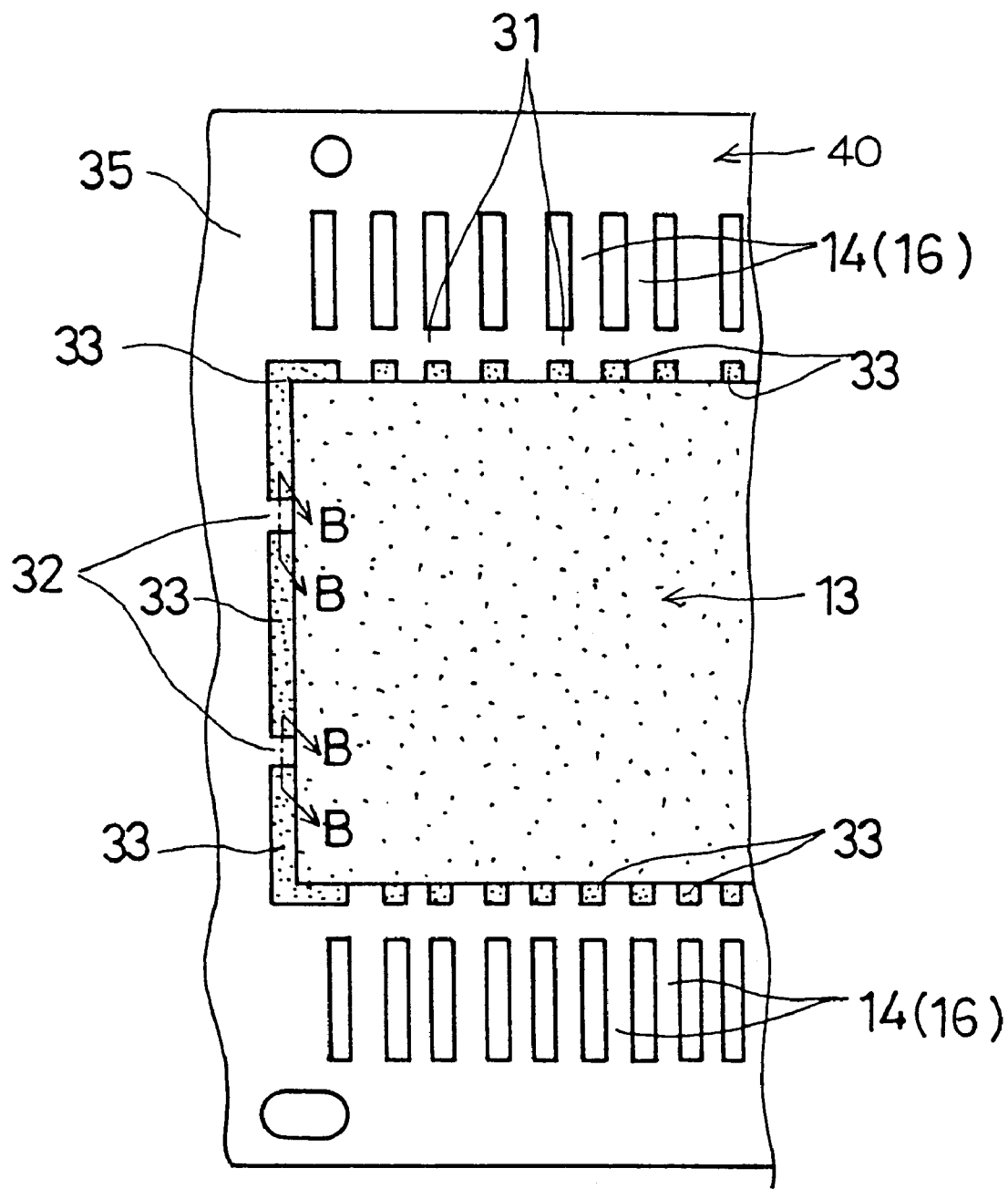
FIG. 16 illustrates a conventional lead frame cutting step.

FIG. 15 illustrates the lead frame cutting step. In the lead frame cutting step, a lead frame 40 provided with the resin package 13 for sealing the semiconductor chip 12 mounted on the stage 17 is stamped so as to cut tie bars 31 for connecting adjacent leads 14 and also cut support bars for connecting the stage 17 and a cradle 35.

When resin-molding the semiconductor chip 12 mounted on the stage 17 to form the resin package 13, the upper mold and the lower mold of the metal mold for the resin molding cramp the lead frame 40. In the cramping position, there is a little resin leak, and the lead frame 40 is provided with the tie bars 31. There is also a resin leak between the stage 17 and the cradle 35 formed in the vicinity of the support bars 32 (the resin leak will be hereinafter referred to as the leak resin 33).

The leak resin 33 inside the tie bars 31 are removed at the same time as cutting of the tie bars 31, so that the leak resin 33 does not become a problem after the lead frame cutting step. On the other hand, the support bars 32 are conventionally cut only at the positions indicated by arrows B—B in FIG. 16. As a result, the leak resin 33 remains between the cradle 35 and the stage 17 after the cutting of the support bars 32.

The leak resin 33 remaining on the exterior of the resin package 13 may separate from the resin package 13 after the lead frame cutting step, only to cause many problems. For instance, if the leak resin 33 separates from the resin package 13 in the mounting step of mounting the semiconductor device 10 to the printed-circuit board, the lead resin 33 often adheres to the leads 14, thereby causing a problem that the leads 14 and the printed-circuit board cannot be soldered well. Because of this, a step of removing the leak resin 33 is conventionally necessary after the cutting of the support bars 32.

On the other hand, when the support bars 32 are cut in this embodiment, the region of the leak resin 33 is also cut in the position indicated by the line C—C. In this manner, the leak resin 33 can be removed at the same time as the support bars 32 are cut. The conventional two steps of cutting the stage 17 and removing the leak resin 33 can be carried out simultaneously to simplify the producing procedures of the semiconductor device.

Figure 17:
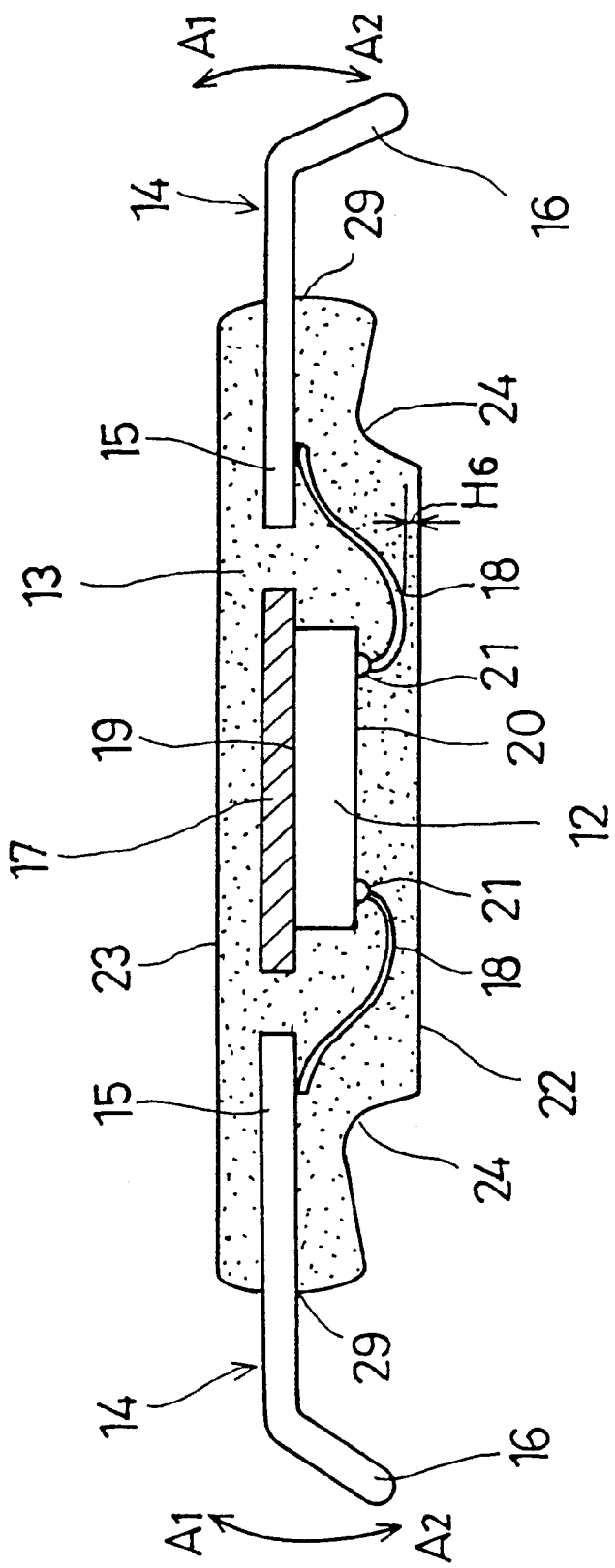
FIG. 17 illustrates a lead molding step in the method of producing the semiconductor device of the present invention.
Figure 18:
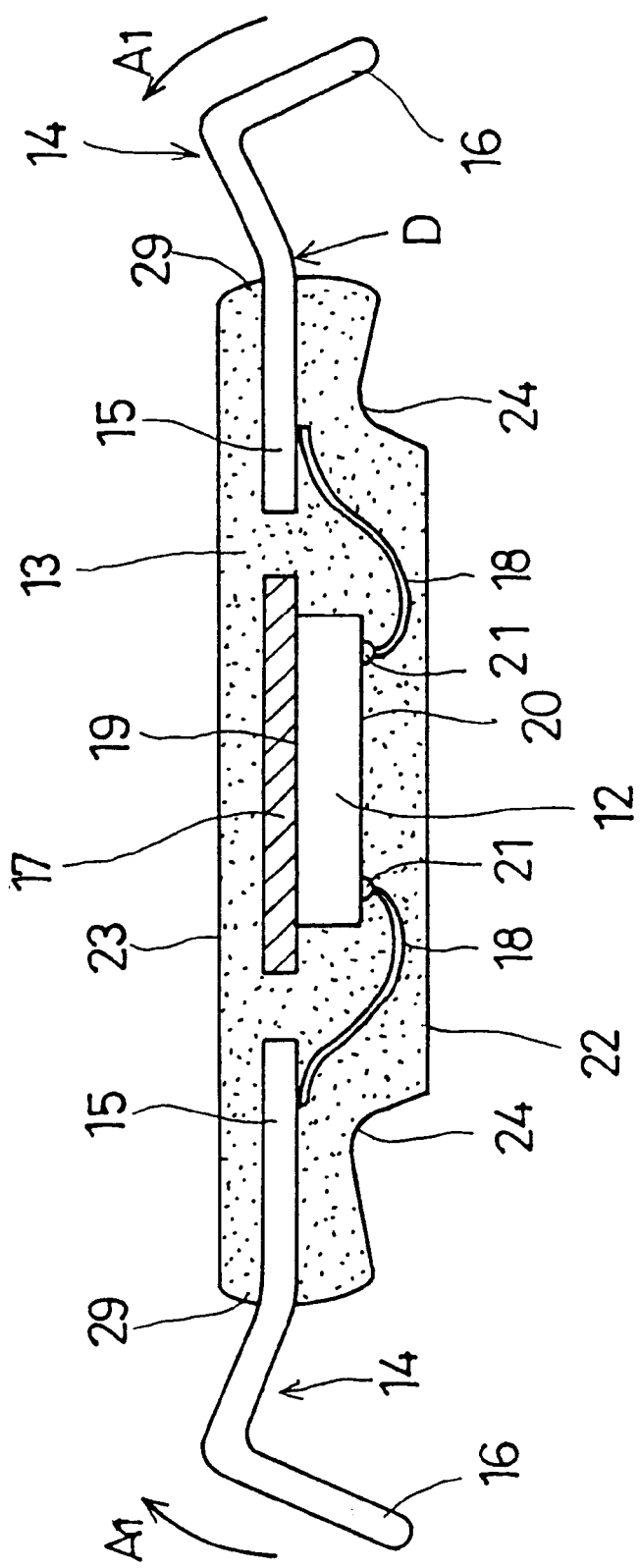
FIG. 18 illustrates the lead molding step in the method of producing the semiconductor device of the present invention.
Figure 19:
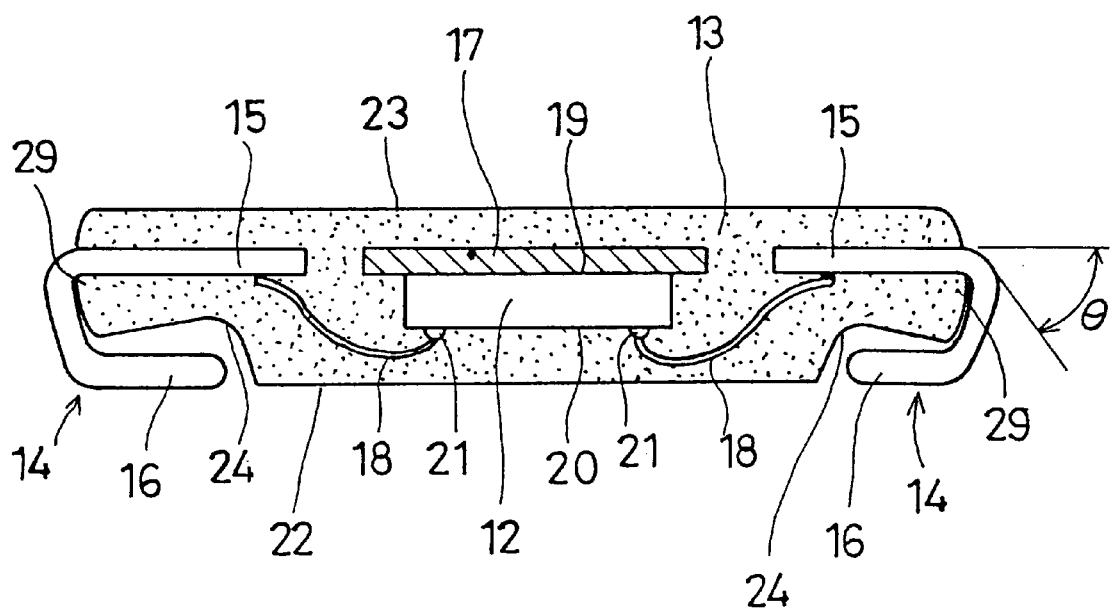
FIG. 19 illustrates a conventional lead molding step.

The lead frame cutting step is followed by the lead molding step. FIGS. 17 to 19 illustrate the lead molding step (hereinafter, the "outer leads 16" includes the "four-corner outer leads 16A").

In the lead molding step, the leads 14 extending outward from the resin package 13 (i.e., the outer leads 16) are bent inward along the exterior of the resin package 13 so as to form the predetermined shape as shown in FIG. 4.

The outer leads 16 are first bent at a position at a predetermined distance from the edges (first bending process). FIG. 17 illustrates the semiconductor device after the first bending process. The bent portions are engaged with the notches 24.

After the first bending process, a second bending process is carried out to temporarily bend the outer leads 16 in the opposite direction (indicated by an arrow A1 in FIG. 17). Here, the "opposite direction" refers to the direction opposite to the direction (indicated by an arrow A2) of bending to form the outer leads 16 into the predetermined shape as shown in FIG. 4. After the second bending process, a third bending process is carried out to bend the outer leads 16 in the direction of A2 so as to form the outer leads 16 into the predetermined shape as shown in FIG. 4.

As described above, the outer leads 16 are temporarily bent in the opposite direction of A1 before being bent in the direction of A2. This improves the formation precision of the outer leads 16 for the following reasons.

Before the second bending process, the outer leads 16 horizontally extend from the end portions 29 of the resin package 13. If the outer leads 16 are bent in the direction of A2 without being temporarily bent in the opposite direction, the outer leads 16 start bending with the end portions 29 being the support.

FIG. 19 illustrates the outer leads 16 directly bent in the direction of A2. By this bending technique, the outer leads 16 bend at the end portions 29 of the resin package 13, as shown in the figure. The outer leads 16 in such a condition are not stabilized, and are varied in size as indicated by an arrow θ in the figure. This may attribute to the unsteadiness of the end portions 29 of the resin package 13 (for instance, varied cutting positions of the leak resin 33). By the conventional cutting technique, an excessive load is applied to the end portions 29 of the resin package 13.

In this embodiment, on the other hand, the second bending process of bending the outer leads 16 in the opposite direction (A1 direction) is carried out, followed by the third bending process of bending the outer leads 16 in the molding direction (A2 direction). As shown in FIG. 4, the bent portions are at a distance from the end portions 29 of the resin package 13, so that the end portions 29 can be prevented from being subjected to an excessive load. Thus, the formation precision of the outer leads 16 can be improved.

After the temporary bending of the outer leads 16 in the opposite direction (A1 direction) in the second bending process, the outer leads 16 are bent in the molding direction (A2 direction) in the third bending process. Here, the bent portions in the molding direction (A2 direction) are situated at a distance from the end portions 29 of the resin package 13 for the reasons mentioned below.

The second bending process causes plastic deformation at the bent portions indicated by an arrow D in FIG. 18, and work hardening at the points indicated by the arrow D of the outer leads 16. If the outer leads 16 are bent in the molding direction (A2 direction) after the occurrence of the work hardening, the outer leads 16 are not bent at the points D where the work hardening has occurred. This is why the bent portions are situated at a distance from the points D. In experiments by the inventors, the bent portions of the outer leads 16 in the third bending process are uniform with high precision. Thus, the formation precision of the outer leads 16 can be improved.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The present application is based on Japanese priority application Nos. 10-234705 and 11-024307, filed on Aug. 20, 1998, and Feb. 1, 1999, respectively, the entire contents of which are hereby incorporated by reference.

What is claimed is:

1. A semiconductor device comprising:

a resin package;

a semiconductor chip sealed in the resin package; and leads including inner leads electrically connected to the semiconductor chip and outer leads extending outward from the resin package and bonded to a printed-circuit board;

a rear surface ofthe semiconductor chip being substantially flush with the inner leads, the resin package being provided with notches on a mounting surface thereof facing the printed-circuit board, the outer leads being bent inward along an exterior of the resin package so as to be pulled around to the mounting surface, and edges of the outer leads being engaged with the notches wherein the notches are progressively deeper toward an interior from an exterior of the resin package.

2. The semiconductor device according to claim 1, wherein the outer leads are substantially flush with the mounting surface, with the outer leads being situated inside the notches.

3. The semiconductor device according to claim 1, wherein:

the notches formed at four corners of the resin package are longer than the notches formed in positions other than the four corners; and the outer leads formed at the four corners of the resin package are longer than the outer leads formed in places other than the four corners, so that lengths of the outer leads at the four corners correspond to lengths of the notches at the four corners.

4. The semiconductor device according to claim 1, wherein:

the semiconductor chip is mounted on a stage; and the stage and the inner leads are substantially flush with each other.

5. The semiconductor device according to claim 1, wherein:

the semiconductor chip and leads are electrically connected by wires;

the resin package is provided with an index; and the index is situated at a distance from the wires.

6. The semiconductor device according to claim 1, wherein the resin package is provided with an index on which an identification character code is formed.

7. The semiconductor device according to claim 1, wherein the resin package is provided with an index whose optical characteristics are different from optical characteristics of a surface of the resin package.

* * * * *